(12) United States Patent
Gambetta

(10) Patent No.: US 9,477,252 B2
(45) Date of Patent: Oct. 25, 2016

(54) VOLTAGE REGULATOR

(71) Applicant: Dialog Semiconductor (UK) Limited, London (GB)

(72) Inventor: Pietro Gabriele Gambetta, Livorno (IT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/870,118

(22) Filed: Sep. 30, 2015

(65) Prior Publication Data

US 2016/0098057 A1    Apr. 7, 2016

(30) Foreign Application Priority Data

Oct. 2, 2014 (DE) .................. 10 2014 014 690

(51) Int. Cl.
| | |
|---|---|
| H03M 1/48 | (2006.01) |
| G05F 3/26 | (2006.01) |
| G05F 1/46 | (2006.01) |
| H02M 1/00 | (2006.01) |
| H03M 1/00 | (2006.01) |
| H02M 3/158 | (2006.01) |
| G05F 3/30 | (2006.01) |
| G05F 1/575 | (2006.01) |

(52) U.S. Cl.
CPC . *G05F 3/26* (2013.01); *G05F 1/46* (2013.01); *G05F 3/262* (2013.01); *G05F 1/575* (2013.01); *G05F 3/30* (2013.01); *H02M 3/1584* (2013.01); *H02M 2001/0009* (2013.01); *H02M 2001/0025* (2013.01); *H03M 1/00* (2013.01)

(58) Field of Classification Search
CPC ....... H03M 1/00; H03M 3/1584; G05F 3/30; G05F 1/575

USPC ......... 341/115; 323/313, 314, 272, 273, 907
See application file for complete search history.

(56) References Cited

U.S. PATENT DOCUMENTS 7,218,168 B1 * 5/2007 Rahman .................... G05F 1/56
                                                                   323/273
2003/0155899 A1    8/2003 Oglesbee et al.

FOREIGN PATENT DOCUMENTS

DE          10101997         2/2003

OTHER PUBLICATIONS

German Office Action and US Translation 10 2014 014 690.1, Jan. 14, 2015, Dialog Semiconductor (UK) Ltd.

* cited by examiner

*Primary Examiner* — Joseph Lauture
(74) *Attorney, Agent, or Firm* — Saile Ackerman LLC; Stephen B. Ackerman

(57) ABSTRACT

A voltage regulator, which contains a circuit to determine its output power. It has an output node providing an output voltage for a load; current sensing means for sensing an output current flowing at the output node; voltage providing means for providing a digital representation of the output voltage or of an input voltage to the voltage regulator; output power determination means comprising a digitally controllable variable resistance circuit receiving the digital voltage representation from the voltage providing means and generating a resistance, wherein the variable resistance circuit is connected to the current sensing means to obtain a signal that depends upon the output current and generates a voltage depending on the generated resistance and the obtained signal; and the output power determining means are adapted to determine the output power of the voltage regulator based on the voltage generated by the variable resistance circuit.

26 Claims, 3 Drawing Sheets

VOLTAGE REGULATOR

TECHNICAL FIELD

The present document relates to voltage regulators and methods of operating voltage regulators. In particular, the document relates to determining the output power provided by voltage regulators.

BACKGROUND

There are many different types of voltage regulators such as linear regulators (e.g. Low Drop-out Regulators) and switched power converters (e.g. buck or boost converters). Typically, an output voltage produced by a voltage regulator is controlled so as to stay constant at a desired value, independent of an applied load or load transient. The output voltage is typically controlled via a feedback circuit to the desired value. The feedback circuit may generate control signals for regulator amplifiers or switches. Many different types of loads may be connected with and driven by a regulator.

In many cases, it is desired or even necessary to determine the output power of the voltage regulator, for example for controlling the regulator itself, or for controlling the load of the regulator. One way of determining the output power is to measure the output voltage and output current of the regulator and multiplying these values to obtain a power value. However, performing an ongoing multiplication operation in the analog or the digital domain is a complex operation which requires significant system resources and circuit footprint.

SUMMARY

Thus, there is a need to determine the output power of a voltage regulator in a resource-efficient manner. According to an aspect, a voltage regulator is provided, comprising an output node providing an output voltage for a load; current sensing means for sensing an output current flowing at the output node into the load; voltage providing means for providing a digital representation of the output voltage; and output power determination means comprising a digitally controllable variable resistance circuit receiving the digital voltage representation from the voltage providing means and generating a resistance depending on the received digital voltage representation. Alternatively, the voltage providing means may provide a digital representation of an input voltage to the voltage regulator, wherein the input and the output voltage of the voltage regulator may have a predetermined relationship to each other. The voltage providing means may e.g. provide a reference voltage of the voltage regulator to the output power determination means, wherein the voltage regulator controls its output voltage to be substantially equal to the reference voltage. In some cases, the reference voltage is already provided in digital form to the voltage regulator so that it can be directly provided as digital voltage representation by the voltage providing means to the output power determination means. No additional analog digital conversion is needed, which reduces the costs of the regulator circuit by saving chip area.

The variable resistance circuit may be connected to the current sensing means to obtain a signal that depends upon the output current. The variable resistance circuit may comprise a resistor whose resistance value is controllable, in particular in steps corresponding to the received digital voltage representation. In other words, the resistance value of the variable resistance circuit may be set to a value as indicated by the digital voltage representation. For example, a switchable resistance network is provided in the variable resistance circuit and controlled based on the digital voltage representation, by switching resistors on and off in the network so that the desired resistance value is obtained.

The variable resistance circuit may generate a voltage depending on the generated resistance and on the obtained signal from the current sensing means. Since the signal from the current sensing means depends upon the output current and the resistance of the variable resistance circuit depends on the input voltage or the output voltage of the regulator (as represented by the digital voltage representation), the voltage generated by the variable resistance circuit is directly proportional to the input power or the output power of the voltage regulator, respectively. For example, the signal from the current sensing means is a current that is proportional to the regulator output current. This current is then applied to the resistance generated by the variable resistance circuit. Hence, the voltage drop across the generated resistance is a signal that is indicative of (e.g. directly proportional) to the input or output power, depending on whether the digital representation corresponds to the regulated output voltage or the input voltage of the voltage regulator.

The output power determining means may then determine the output power of the voltage regulator based on the voltage generated by the variable resistance circuit. This determination may be performed in the analog domain or in the digital domain e.g. by a simple scaling operation. By considering the known efficiency of the regulator, input power and output power values can be converted. Thus, the output power can be determined without performing an analog or digital multiplication of voltage and current. Similarly, an input power could be determined using an input current and input power of the voltage regulator. In this case, the output power could be determined based on the input power and a known efficiency of the voltage regulator.

In embodiments, the current sensing means may comprise a controllable current source that generates a current that is proportional to the output current. Such controllable current sources are known in the art and allow a simple measurement of the regulator output current. Current sensing means typically generate an electrical magnitude (voltage or current) proportional to the sensed current in the regulator. The sensed current may be either the current through the pass device (e.g. through a high side or low side transistor) or the current through a coil (in a switching converter case). For example, an easy way to implement the current sensing means is to sense the voltage drop across the pass device or the coil (or a sensing resistor) by means of an amplifier (e.g. an Operational Transconductance Amplifier OTA).

In embodiments, the variable resistance circuit may comprise a series of resistors, i.e. a plurality of resistors connected in series, like a voltage divider having many successive resistors. The series of resistors has an overall resistance value for all resistors in series and partial resistance values for subsequences of the resistors. Depending on the digital voltage representation, a subsequence of the resistors may be selected, thereby providing a digitally controllable resistance value. One terminal of the series may be connected to ground. The other terminal may be connected to the current sensing means to receive the signal that depends upon the output current. Typically, this signal is a current that is proportional to the output current, as generated by the current sensing means. By submitting this current to the variable resistance circuit, a voltage drop is generated across the overall resistance of the variable resistance circuit that depends on the output current. Further, the selected partial resistance depends on which subsequence of the series of resistors is selected. Thus, the generated effective resistance value of the variable resistance circuit is controlled by the digital voltage representation, so that the voltage drop also depends on the input or output voltage of the regulator. Altogether, the voltage drop across the generated resistance is indicative of, e.g. proportional to, the output power.

The variable resistance circuit may further comprise a multiplexer having inputs connected to nodes between resistors of the series of resistors. By selecting a node of the series of resistors, the selectable resistance value of the variable resistance circuit is determined. In other words, the multiplexer inputs connect to the nodes of the voltage divider to sample different divided voltages, i.e. the voltage drops at subsequences of the series.

The input of the multiplexer may be selected based on the digital voltage representation received from the voltage providing means, thereby selecting a resistance ratio of the voltage divider and one of the divided voltages as input to the multiplexer. The selected voltage is provided at the multiplexer output. In other words, the digital voltage representation determines which resistance ratio is selected as effective resistance of the variable resistance circuit (as seen at the multiplexer output), and which divided voltage of the series of resistors is selected and output by the multiplexer.

By appropriately selecting a multiplexer input (and the corresponding divided voltage) based on the digital voltage representation, an effective resistance value is generated that is proportional (step-wise in a digital manner) to the input or output voltage, and the voltage at the multiplexer output is proportional to the input or output power. If the current drawn from the multiplexer output is small (which is typically the case when only measuring the voltage at the multiplexer output), the load to the current sensing means is determined by the overall resistance value for the series of resistors and is constant (i.e. independent of the selected multiplexer input and the generated effective resistance value). This allows measuring power with high accuracy.

For measuring the voltage generated by the variable resistance circuit (e.g. at the multiplexer output), an analog to digital converter coupled with the variable resistance circuit may be provided. The analog to digital converter generates a digital representation of the voltage generated by the variable resistance circuit. The output power determining means may receive the digital representation of the voltage generated by the variable resistance circuit and may determine the output power in the digital domain, e.g. by a simple scaling operation to consider the various constants of proportionality. Preferably, the scaling operation may be implemented in the digital domain as a shifting operation. In case that the digital voltage representation corresponds to the input voltage of the regulator, the regulator efficiency can be factored in the calculation, i.e. the scaling operation.

In another aspect, a voltage regulator is provided, comprising an output node providing a regulated output voltage for a load; current sensing means for sensing an output current flowing at the output node; voltage providing means for providing a digital representation of the regulated output voltage or of an input voltage to the voltage regulator; and output power determination means comprising an analog to digital converter (ADC) having a digitally controllable gain. The ADC may be connected to the current sensing means to receive a signal that depends on the output current and may generate a digital value based on the received signal and the set ADC gain value. The ADC may receive the digital voltage representation from the voltage providing means and control the ADC gain value depending on the digital voltage representation. Typically, the ADC gain value is set inversely proportional to the digital voltage representation. The digital value generated by the ADC may then be proportional to the output power of the voltage regulator. In some cases, a reference voltage is already provided in digital form to the voltage regulator so that it can be directly provided as digital voltage representation by the voltage providing means to the ADC. No additional analog digital conversion is needed, which reduces the costs of the regulator circuit by saving chip area.

The output power determining means may determine the output power of the voltage regulator based on the digital value generated by the ADC, possibly taking into account the regulator efficiency. The output power determining means may comprise means to scale or multiply the digital value to determine the output power of the voltage regulator. Preferably, all factors are combined into a single scaling or multiplication operation.

In embodiments, the ADC may be a successive approximation register (SAR) ADC. However, it should be noted that other ADC types are possible, too. The successive approximation register ADC may comprise a comparator, a register, a digital analog converter (DAC), and a logic unit that controls the register value based on a comparator result. Usage of a SAR ADC allows an efficient implementation of the ADC and an efficient integration of the ADC into the voltage regulator.

The digital analog converter may generate a quantity based on the value stored in the ADC register. The comparator (e.g. an operational amplifier) may be coupled with the current sensing means and the digital analog converter as inputs and generate the comparator result based on the received input values. Depending on the comparator result, the logic unit may increment or decrement the register value, thereby adapting the generated quantity so as to approximate, by the generated quantity, the signal from the current sensing means. Once the generated quantity is close enough (in the sense of a digital resolution) to the signal from the current sensing means, adaptation by the logic unit may be stopped and the present register value is a digital representation that corresponds to the signal from the current sensing means. In other words, the register value is proportional to the output current. By appropriately setting the gain value of the ADC (e.g. to be inversely proportional to the digital voltage representation of the input/output voltage), one can achieve that the register value is indicative of the input or output power, e.g. proportional to the input/output power. The output power determining means may receive the register value of the ADC and may determine the output power in the digital domain, e.g. by a simple scaling operation to consider the various constants of proportionality. Preferably, the scaling operation may be implemented in the digital domain as a shifting operation. In case that the digital voltage representation corresponds to the input voltage of the regulator, the regulator efficiency can be factored in the calculation, i.e. the scaling operation.

In embodiments, the digital analog converter may generate, as the quantity, a DAC current that corresponds to the register value of the ADC. The DAC current may then be converted to a voltage (e.g. by applying the DAC current to a resistor) that is input to the comparator for comparison with the signal from the current sensing means. If the signal from the current sensing means is a current that is proportional to the regulator output current, then the current from the current sensing means may be applied to a resistor to be converted to a voltage which can be input to the comparator (e.g. an operational amplifier).

In embodiments, the digital analog converter may comprise an array of switchable current sources. Preferably, the current sources are individually switchable and the current sources are switched on/off based on the register value. Each current source may contribute to the DAC current when switched on. Thus, the DAC current corresponds to the register value. For example, during operation when the DAC current matches the current from the current sensing means (i.e. the corresponding voltages at the comparator inputs are the same), the ADC adaptation stops and the present register value corresponds to the output current. By appropriately setting the ADC gain, the register value further corresponds to the input or output power.

The digital analog converter may comprise a multiple current mirror having a shared reference portion and multiple mirror portions. The mirror portions each mirror the current flowing in the reference portion. In other words, a plurality of associated current mirrors is provided where the current mirrors are linked via the shared reference portion. It must be noted that the currents in the mirror portions are not necessarily identical to the current flowing in the reference portion, nor do all currents in the mirror portions have to be the same. Rather, each current in a mirror portion has a fixed relationship to the current in the reference portion wherein the individual relationships of different mirror portions may be different. Such arrangement allows an efficient implementation of the array of switchable current sources, where one mirror portion is provided for each current source.

Further, the current flow through the reference portion may be controllable to provide the variable gain of the ADC. In other words, the variable ADC gain may be implemented by controlling the current through the reference portion of the multiple current mirrors. The reference portion may comprise at least one diode coupled reference transistor.

Each current source may comprise a mirror transistor having its source and gate coupled in parallel with a source and gate of the at least one reference transistor, and a switching transistor in series with the mirror transistor and controlled based on the ADC register value. By controlling the switching transistors, the current sources are individually switched on/off based on the register value, thereby generating the DAC current to correspond to the ADC register value.

The reference portion may comprise a plurality of parallel diode coupled reference transistors in switchable branches. Each branch may further comprise a switching transistor in series with the respective reference transistor. By controlling the individual switching transistors of the reference portion based on the digital voltage representation, the current flow through the reference portion and hence the ADC gain are controlled. The drains of the switching transistors in the reference portion may be coupled and connected with a common reference current source. Further, the gates of the reference transistors in the reference portion and the gates of the mirror transistors in the mirror portion may be coupled with the common reference current source to provide the diode coupling of the transistors.

The voltage regulator may be a linear or switched regulator, or any other type of regulator that produces a regulated output voltage. The present invention allows an accurate and efficient determination of the output power of the voltage regulator.

According to an aspect, any of the above disclosed voltage regulators may further comprise a digital to analog converter receiving a digital representation of a desired output voltage and generating an analogue reference voltage corresponding to the desired output voltage. This is particular useful when a digital representation of a desired output voltage is already available from a higher layer control instance of the voltage regulator. The voltage providing means may directly provide the digital representation of the desired output voltage as digital voltage representation to the output power determination means (without any analog digital conversion), for controlling the variable resistance that is supplied with the signal from the current sensing means (e.g. a current proportional to the output current) to generate the voltage drop that is indicative of the measured power, or for controlling the ADC gain.

The voltage regulator may further comprise a comparator receiving the fed back output voltage of the voltage regulator and the reference voltage as inputs. The comparator may generate a control signal for the voltage regulator, based on the compare result. For example, if the output voltage is smaller than the reference signal, the comparator may generate a signal that opens a switch or drive an amplifier to cause the output voltage to increase, until the output voltage exceeds the reference signal and the comparator reverses his output. In other words, the comparator may be part of a feedback control loop that regulates the output voltage.

In embodiments, the voltage providing means may comprise an analogue to digital converter receiving the input voltage or the output voltage of the voltage regulator in the analog domain and generating the digital voltage representation. The voltage providing means may provide the thus generated digital representation of the input or output voltage to the variable resistance circuit to control the variable resistance that is supplied with the signal from the current sensing means (e.g. a current proportional to the output current) to generate the voltage drop that is indicative of the measured power. Alternatively, the voltage providing means may provide the thus generated digital representation of the input or output voltage to control the ADC gain.

If the voltage regulator input voltage is used to generate the digital voltage representation, the output power determining means may determine the output power of the voltage regulator based on the voltage generated by the output power determination means and a predetermined efficiency of the voltage regulator. Since the regulator efficiency is a known and fixed value, the multiplication may be integrated into the scaling operation performed by the output power determining means, without any additional efforts.

The above aspects may as well be implemented as methods. For example, a method to determine the output power of a voltage regulator may comprise sensing an output current flowing at an output node of the voltage regulator into an attached load; providing a digital representation of a output voltage at the output node; controlling a variable resistance circuit to generate a resistance value depending on the digital voltage representation; supplying to the variable resistance circuit a current that is proportional to the output current; and determining the output power of the voltage regulator based on a voltage dropping at the variable resistance circuit. Alternatively, an input voltage to the voltage regulator may be provided as digital representation and used to control the variable resistance value of the variable resistance circuit.

The controlling of a variable resistance circuit to generate a resistance value may comprise selecting an input of a multiplexer based on the digital voltage representation, wherein the variable resistance circuit comprises a series of resistors. One terminal of the series may be connected to ground; the other terminal may receive the supplied current. The multiplexer may have inputs connected to nodes between resistors of the series of resistors.

Another method to determine the output power of a voltage regulator may comprise sensing an output current flowing at an output node of the voltage regulator; providing a digital representation of a output voltage at the output node; controlling the gain of an analog to digital converter (ADC) depending on the digital voltage representation; and determining the output power of the voltage regulator based on the digital value generated by the ADC. The ADC may be connected with current sensing means to convert a signal that depends on the output current and may generate a digital value based on the received analog value. Alternatively, an input voltage to the voltage regulator may be provided as digital representation and used to control the gain of the ADC.

The method may further comprise controlling a digital analog converter (DAC) to generate a DAC current by controlling an array of switchable current sources, each current source contributing to the DAC current when switched on; comparing a signal derived from the generated DAC current with the signal that depends on the output current; and controlling the current sources based on the result of the comparing by switching transistors in the current sources. Typically, the ADC gain is set inversely proportional to the digital voltage representation by respectively switching transistors in a reference portion of the array of switchable current sources.

The method may further comprise receiving a digital representation of a desired output voltage and generating an analogue reference voltage based thereon, wherein the providing a digital representation provides the digital representation of the desired output voltage. Then, the output voltage of the voltage regulator and the reference voltage may be compared; and a control signal may be generated to regulate the output voltage of the voltage regulator based on the compare result.

It should be noted that the above mentioned aspects for voltage regulators are applicable for the suggested methods as well and vice versa. Thus, all aspects disclosed for embodiments of devices can be combined in various ways with the suggested methods to achieve similar effects and advantages.

These and other aspects of the invention will be apparent from and elucidated with reference to the embodiments described hereinafter, by way of example, with reference to the drawings.

BRIEF DESCRIPTION OF THE DRAWINGS

Various aspects are explained below in an exemplary manner with reference to the accompanying drawings, wherein.

DESCRIPTION

Figure 1:
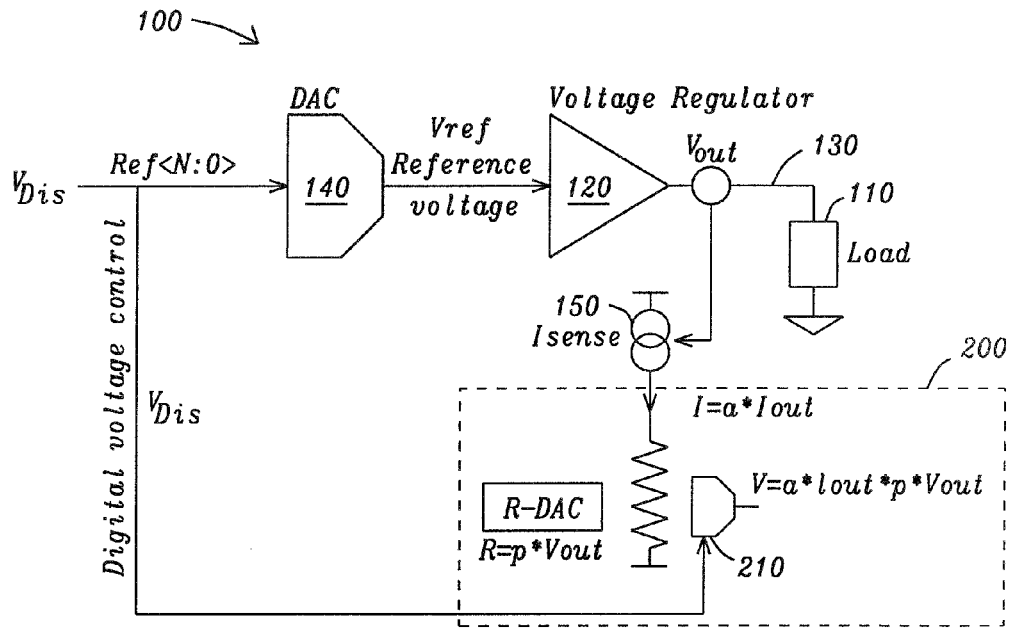
FIG. 1 shows an embodiment of a voltage regulator.

FIG. 1 shows a voltage regulator 100 with a power sensing system 200 which can determine an output power provided to a load without the need for a computationally expensive multiplication of a current and a voltage value. The voltage regulator 100 comprises voltage regulation circuitry 120 for providing a regulated output voltage to an output node 130 connected to the load 110.

The voltage regulation circuitry 120 is controlled using a digital reference voltage value $V_{Dig}$ which is converted into an analog reference voltage $V_{Ref}$ by a digital to analog converter (DAC) 140. In the present embodiment, the output voltage $V_{Out}$ at the output node 130 of the voltage regulation circuitry 120 is equal to the reference voltage $V_{Ref}$ and thus also equal to the digital reference voltage $V_{Dig}$. Alternatively, $V_{Out}$ may be proportional to $V_{Ref}$ or may be related to $V_{Ref}$ according to a known function.

A current sensor 150 is provided which provides a current $I_{sense} = \alpha \ast I_{Out}$ that is proportional to the current $I_{Out}$ at the output node 130 of the voltage regulation circuitry 120, wherein $\alpha$ is the gain of the current sensor 150.

The power sensing system 200 determines the output power $W_{Out}$ at the output node, wherein $W_{Out} = I_{Out} \ast V_{Out}$ for an output current $I_{Out}$ and an output voltage $V_{Out}$. In the present embodiment, the power sensing system 200 comprises a resistive digital to analog converter (R-DAC) 210. Further, the output voltage $V_{Out}$ is controlled by the voltage regulation circuitry 120 such that it is equal to the digital reference voltage $V_{Dig}$ which is converted by the DAC 140 into the reference voltage $V_{Ref}$ for controlling the operation of the voltage regulation circuitry 120.

During operation of the R-DAC 210, the resistance value R is controlled to be proportional to the digital reference voltage value $V_{Dig}$, so that $R = \rho \ast V_{Dig}$, wherein $\rho[\Omega/V]$ is the gain of the R-DAC 210. The current $I_{sense} = \alpha \ast I_{Out}$ which is provided by the current sensor 150 is connected to the resistor of the R-DAC 210, so that the voltage drop at the R-DAC 210 is equal to:

$$V_{R-DAC} = \alpha \ast I_{Out} \ast \rho \ast V_{Out}$$

Hence, $V_{R-DAC}$ is proportional to the output power $I_{Out} \ast V_{Out}$ which is supplied to the load 110 at the output node 130.

The resulting power sensing system 200 is extremely simple and only requires a R-DAC 210 as a power sensing component, since it may reuse the available current sensing structure which is usually present in many current mode voltage regulators. Since, in the present embodiment, the voltage regulator circuitry 120 is controlled using a digital reference voltage $V_{Dig}$, digital output voltage information is available to the R-DAC 210 without the need for a dedicated ADC for output voltage digitalization. However, as a possible modification, the output voltage $V_{Out}$ at the output node 130 may be digitized and may be used for adjusting the resistive value of the R-DAC 210. If the reference voltage $V_{Ref}$ is supplied to the voltage regulator circuitry 120 as an analog voltage, it may be supplied to an ADC and the digitized value of $V_{Ref}$ may then be used for adjusting the resistive value of the R-DAC 210.

As a possible implementation of the R-DAC 210, a series of resistors may be used, wherein digital switches are provided at the nodes between two successive resistors in the series. Thus, the resistance value of the R-DAC 210 can be adjusted by controlling the switches so that the sum of the individual resistances connected in series is proportional (in a step-wise digital manner) to the digital reference voltage $V_{Dig}$. Therein, the resolution (bit size) of the digital reference voltage $V_{Dig}$ and the resolution of the resistance adjustment using the switches of the RDAC 210 both determine the accuracy of the (step-wise) proportionality between the resistance value and the digital reference voltage $V_{Dig}$.

Figure 2:
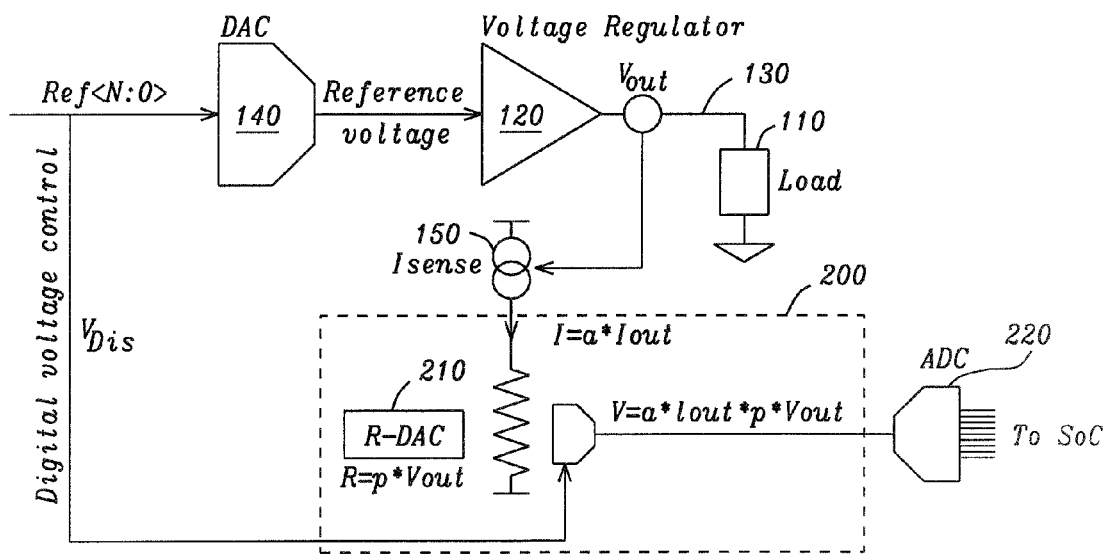
FIG. 2 shows another embodiment of a voltage regulator.

As shown in FIG. 2, the voltage output by the power sensing system 200 can then be sampled through an ADC 220 in order to provide a digital value of the output power of the output node 130 of the voltage regulator 100. The power information can then be digitally processed without the need to perform any multiplication calculations in order to arrive at the output power value. From the ADC 220, the power information can then be e.g. passed on to a system on a chip (SoC) for further processing.

Figure 3:
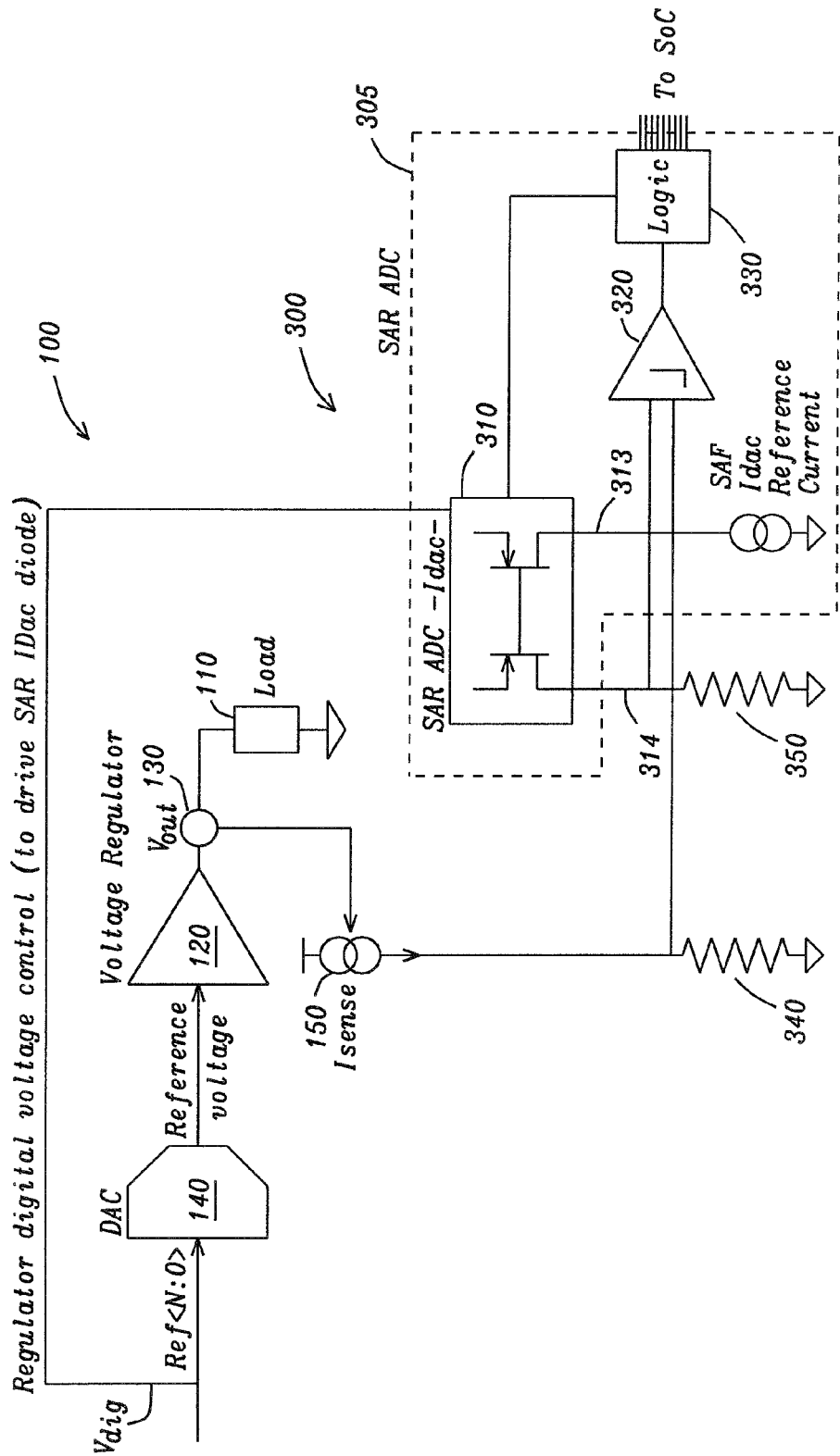
FIG. 3 shows a further embodiment of a voltage regulator.

According to a further embodiment, as depicted in FIG. 3, a power sensing system 300 for determining the output power $W_{Out}=I_{Out}*V_{Out}$ supplied to the load 110 at the output node 130 of the voltage regulator 100 comprises a variable gain ADC 305. Thus, instead of the RDAC 210 of the previous embodiment, the present embodiment uses the variable gain ADC 305 to generate a value (here a digital value) that is proportional to $W_{Out}$.

One possible implementation uses a successive approximation register (SAR) ADC 305. Within the SAR ADC 305, the reference current is driven by the digital reference voltage value $V_{Dig}$ to produce a controllable gain. The SAR ADC comprises an IDAC 310 that is controlled by an ADC register value.

As shown in FIG. 3, a comparator 320 and control logic 330 may be used to adjust the output current 314 of the IDAC 310, such that the voltage drop at the resistor 350 connected to the output current 314 of the IDAC 310 is equal to the voltage drop at the resistor 340 connected to the output of the current sensor 150. The control logic 330 may include the necessary logic to change the ADC register value based on the comparator result 320 to successively approximate the voltage at resistor 340 by the voltage produced by the IDAC output current 314. With the gain value of the IDAC 310 set in accordance to the digital reference voltage $V_{Dig}$ of the voltage regulator circuitry 120, and the voltage drop at the resistor 340 being proportional to the output current at the output node 130 of the voltage regulator circuitry 120, the ADC register value is proportional to the power $W_{Out}$ at the output node 130 of the voltage regulator 100.

Figure 4:
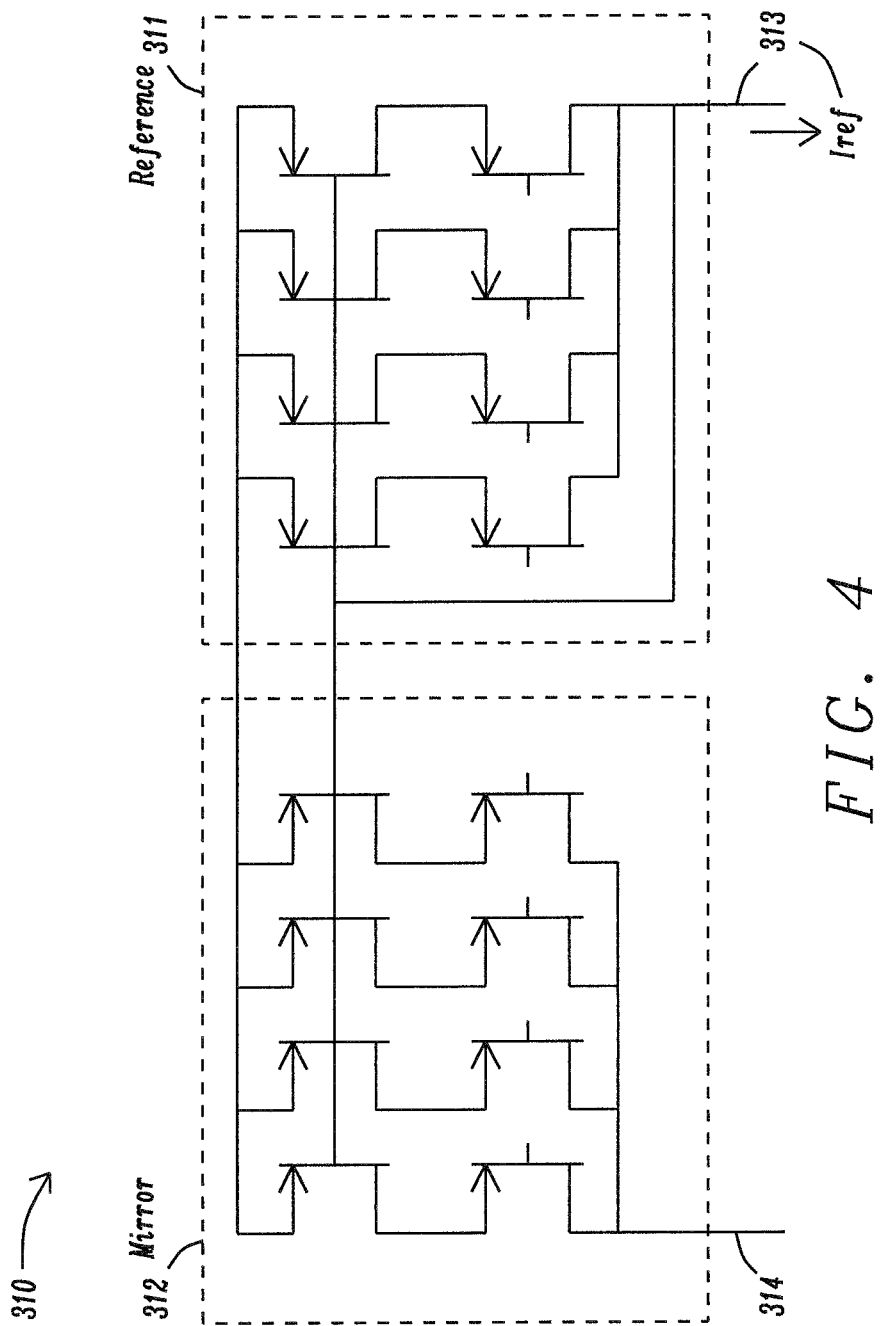
FIG. 4 shows an example of a successive approximation register for use with a power sensing system of the voltage regulator as shown in FIG. 3.

An example for an IDAC 310 as used in the embodiment of FIG. 3 is shown in FIG. 4. The IDAC 310 comprises a reference portion 311 and a mirror portion 312. The reference portion 311 comprises a number of diode coupled reference transistors through which (in combination) the IDAC reference current 313 flows. The reference transistors are switched according to the digital reference value input into the reference portion 311. In the present embodiment, the digital reference voltage $V_{Dig}$ of the voltage regulator circuitry 120 is used as reference for the IDAC 310, however, any digitized value proportional to the output voltage $V_{Out}$ at the output node 130 could be used as a reference value for the IDAC 310, to set the gain of ADC 300, e.g. inversely proportional to the digital reference voltage $V_{Dig}$.

The mirror portion 312 comprises a number of switched mirror transistors which are controlled based on the ADC register value. The respective source and gate of a mirror transistor are coupled in parallel with the source and gate of the corresponding reference transistor. According to embodiments, the mirror transistors source respectively different current values, e.g. binary scaled current values. The sum of the current values contributed by the mirror transistors is output as the IDAC output current 314. Thus, the digital register value may be translated into a corresponding DAC output current 314 by switching the binary-valued mirror transistors.

Further, the gates of the reference transistors in the reference portion 311 and the gates of the mirror transistors in the mirror portion 312 may be coupled with a common reference current source which provides the IDAC reference current 313 to the diode coupling of the transistors.

After adjusting the gain of the IDAC 310 such that the voltage drop of the IDAC output current 314 at the resistor 350 is equal to the voltage drop of the current as measured by the current sensor 150 at the resistor 340, the value N stored in the register of the ADC 300 is passed on to the logic circuitry 330, from where it can be passed on further e.g. to a system on a chip (SoC).

As will be shown below, the value N stored in the ADC register is proportional to the output power at the output node 130 of the voltage regulator:

$$N = \left\lfloor (2^m - 1) * \frac{\alpha * I_{out} * R}{I_{ref} * G(Idac) * R} \right\rfloor$$

where:
N is the output code (i.e. the register value) of the ADC 300
M is the number of bits of the ADC 300
$I_{ref}$ is the IDAC reference current 313
G(Idac) is the gain of the IDAC reference portion.

The gain of the IDAC reference portion 311 is equal to the IDAC source size at <111 ... 11> divided by the IDAC diode size. The "size" corresponds to the number of modules or current sources. The IDAC gain can be expressed in many different ways such as current per LSB (least significant bit) of the IDAC. Further, the current per LSB is directly proportional to the IDAC mirror current source "size" (W/L) and inversely proportional to the IDAC mirror diode "size" (W/L), where (W/L) refers to the ratio of transistor channel width W to transistor channel length L.

Since the reference diode "size" is made inversely proportional to the output voltage $V_{Out}$ of the regulator by driving it by the digital control voltage $V_{Dig}$, the resulting output IDAC Gain is inversely proportional to $V_{Out}$:

$$G(Idac) = \frac{source}{diode} \propto \frac{1}{Vout}$$

Diode "size" refers to the W/L of a diode (or diode coupled transistor) in the IDAC reference portion 311 or the number of modules. It corresponds to a current mirror gain: $I_{Out}$ vs. $I_{in}$.

Thus, the output code N of the register of the ADC 300 can be expressed as:

$$N = \left\lfloor (2^m - 1) * \frac{\alpha * I_{out}}{\beta/V_{out}} \right\rfloor = \left\lfloor (2^m - 1) * \frac{\alpha * I_{out} * V_{out}}{\beta} \right\rfloor = \left\lfloor (2^m - 1) * \frac{\alpha * W_{out}}{\beta} \right\rfloor$$

where β is some linear factor.

Thus, the output N of the register of the ADC 300, that may be implemented in the logic circuitry 330, is proportional to the output power $W_{Out}$ and can be used to determine the value of $W_{Out}$ by a scaling operation. Preferably, the scaling operation may be implemented in the digital domain as a shifting operation. In case that the digital voltage representation corresponds to the input voltage of the regulator, the regulator efficiency can be factored in the calculation, i.e. the scaling operation.

The voltage regulator may be a linear or switched regulator, or any other type of regulator that produces a regulated output voltage. The present invention allows an accurate and efficient determination of the output power of the voltage regulator without the need to perform a multiplication calculation operation. The various embodiments described above each provide an output power determination means without the need of digital post-processing the result, wherein the various different power determination means each have no active components, i.e. no amplifiers and no active multipliers. Further, there is no need for phase detectors or full wave rectifiers.

The above-described power determination can be implemented for both input and output power of the voltage regulator. For estimating input power, input voltage information and a measurement of the input current may be used, and for output power, input or output voltage information and an output current measurement may be used, if the relationship between input and output voltages of the voltage regulator is known.

It should be noted that the description and drawings merely illustrate the principles of the proposed methods and devices. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Finally, it should be noted that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A voltage regulator comprising
an output node providing an output voltage for a load;
current sensing means for sensing an output current flowing at the output node;
voltage providing means for providing a digital representation of the output voltage or of an input voltage to the voltage regulator;
output power determination means comprising a digitally controllable variable resistance circuit receiving the digital voltage representation from the voltage providing means and generating a resistance depending thereon,
wherein the variable resistance circuit is connected to the current sensing means to obtain a signal that depends upon the output current and generates a voltage depending on the generated resistance and the obtained signal; and
wherein the output power determining means are adapted to determine the output power of the voltage regulator based on the voltage generated by the variable resistance circuit.

2. The voltage regulator of claim 1, wherein the current sensing means comprises a controllable current source that generates a current that is proportional to the output current.

3. The voltage regulator of claim 1, wherein the variable resistance circuit comprises a series of resistors, one terminal of the series connected to ground, the other terminal connected to the current sensing means, and a multiplexer having inputs connected to nodes between resistors of the series of resistors.

4. The voltage regulator of claim 3, wherein an input of the multiplexer is selected based on the digital voltage representation received from the voltage providing means.

5. The voltage regulator of claim 1, further comprising an analog to digital converter coupled with the variable resistance circuit to generate a digital representation of the voltage generated by the variable resistance circuit, the output power determining means receiving the digital representation of the voltage generated by the variable resistance circuit and determining the output power in the digital domain.

6. A voltage regulator comprising
an output node providing an output voltage for a load;
current sensing means for sensing an output current flowing at the output node;
voltage providing means for providing a digital representation of the output voltage or of an input voltage to the voltage regulator;
output power determination means comprising an analog to digital converter (ADC) having a digitally controllable gain and connected to the current sensing means to receive a signal that depends on the output current and to generate a digital value based on the received signal and the ADC gain value,
wherein the ADC receives the digital voltage representation from the voltage providing means and wherein the ADC gain value is controlled depending on the digital voltage representation; and
wherein the output power determining means are adapted to determine the output power of the voltage regulator based on the digital value generated by the ADC.

7. The voltage regulator of claim 6, wherein the ADC gain value is set inversely proportional to the digital voltage representation.

8. The voltage regulator of claim 6, wherein the output power of the voltage regulator is proportional to the digital value generated by the ADC and the output power determining means comprise means to scale or multiply the digital value to determine the output power of the voltage regulator.

9. The voltage regulator of any of claim 6, wherein the ADC is a successive approximation register ADC, comprising a comparator, a register, a digital analog converter (DAC), and a logic unit that controls the register value based on a comparator result.

10. The voltage regulator of claim 9, wherein the digital analog converter generates a quantity based on the value stored in the register, the comparator is coupled with the current sensing means and the digital analog converter as inputs and generates the comparator result based on the received input values.

11. The voltage regulator of claim 10, wherein the digital analog converter generates a DAC current that corresponds to the register value, the DAC current being converted to a voltage that is input to the comparator for comparison with the signal from the current sensing means.

12. The voltage regulator of claim 9, wherein the digital analog converter comprises an array of switchable current sources, each current source contributing to the DAC current when switched on, the current sources switched based on the register value.

13. The voltage regulator of claim 12, wherein the digital analog converter comprises a multiple current mirror having a reference portion and multiple mirror portions, one mirror portion for each current source, the current flow through the reference portion controllable to provide the variable gain of the ADC.

14. The voltage regulator of claim 13, wherein the reference portion comprises at least one diode coupled reference transistor, each current source comprising a mirror transistor having its source and gate coupled in parallel with a source and gate of the reference transistor, and a switching transistor in series with the mirror transistor and controlled based on the register value.

15. The voltage regulator of claim 13, wherein the reference portion comprises a plurality of parallel diode coupled reference transistors in branches, each branch further comprising a switching transistor in series with the respective reference transistor and controlled based on the digital voltage representation to generate the ADC gain.

16. The voltage regulator of claim 6, further comprising a digital to analog converter receiving a digital representation of a desired output voltage and generating an analogue reference voltage, the voltage providing means providing the digital representation of the desired output voltage to the output power determination means.

17. The voltage regulator of claim 16, further comprising a comparator receiving the output voltage of the voltage regulator and the reference voltage and generating a control signal for the voltage regulator.

18. The voltage regulator of claim 6, wherein the voltage providing means comprises an analogue to digital converter receiving the input voltage or the output voltage of the voltage regulator and generating the digital voltage representation.

19. The voltage regulator of claim 18, wherein the voltage providing means provides the digital representation of the input voltage of the voltage regulator to the output power determination means and the output power determining means determines the output power of the voltage regulator based on the voltage generated by the output power determination means and a pre-determined efficiency of the voltage regulator.

20. The voltage regulator of claim 6, wherein the voltage regulator is a linear or switched regulator.

21. A method to determine the output power of a voltage regulator, comprising sensing an output current flowing at an output node of the voltage regulator;
providing a digital representation of a output voltage at the output node or of an input voltage to the voltage regulator;
controlling a variable resistance circuit to generate a resistance value depending on the digital voltage representation;
supplying to the variable resistance circuit a current that is proportional to the output current; and
determining the output power of the voltage regulator based on a voltage dropping at the variable resistance circuit.

22. The method of claim 21, wherein controlling a variable resistance circuit to generate a resistance value comprises
selecting an input of a multiplexer based on the digital voltage representation,
wherein the variable resistance circuit comprises a series of resistors, one terminal of the series connected to ground, the other terminal receiving the supplied current, the multiplexer having inputs connected to nodes between resistors of the series of resistors.

23. The method of claim 21, further comprising
receiving a digital representation of a desired output voltage and generating an analogue reference voltage based thereon, wherein the providing a digital representation provides the desired output voltage;
comparing the output voltage of the voltage regulator and the reference voltage; and
generating a control signal to regulate the output voltage of the voltage regulator based on the compare result.

24. A method to determine the output power of a voltage regulator, comprising
sensing an output current flowing at an output node of the voltage regulator;
providing a digital representation of a output voltage at the output node or of an input voltage to the voltage regulator;
controlling the gain of an analog to digital converter (ADC) depending on the digital voltage representation, the ADC connected to convert a signal that depends on the output current and generating a digital value based on the received analog value; and
determining the output power of the voltage regulator based on the digital value generated by the ADC.

25. The method of claim 24, the method further comprising
controlling a digital analog converter (DAC) to generate a DAC current by controlling an array of switchable current sources, each current source contributing to the DAC current when switched on;
comparing a signal derived from the generated DAC current with the signal that depends on the output current; and
controlling the current sources based on the result of the comparing by switching transistors in the current sources,
wherein the ADC gain is set inversely proportional to the digital voltage representation by switching transistors in a reference portion of the array of switchable current sources.

26. The method of claim 24, further comprising
receiving a digital representation of a desired output voltage and generating an analogue reference voltage based thereon, wherein the providing a digital representation provides the desired output voltage;
comparing the output voltage of the voltage regulator and the reference voltage; and
generating a control signal to regulate the output voltage of the voltage regulator based on the compare result.

* * * * *